United States Patent
Chuang et al.

(10) Patent No.: US 7,323,743 B2
(45) Date of Patent: Jan. 29, 2008

(54) FLOATING GATE

(75) Inventors: Ying-Cheng Chuang, Bade (TW);
Chung-Lin Huang, Taichung (TW);
Chi-Hui Lin, Taipei (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 0 days.

(21) Appl. No.: 11/603,771

(22) Filed: Nov. 22, 2006

(65) Prior Publication Data

US 2007/0063260 A1 Mar. 22, 2007

Related U.S. Application Data

(63) Continuation of application No. 10/764,037, filed on Jan. 23, 2004, now Pat. No. 7,205,603.

(30) Foreign Application Priority Data

Jul. 29, 2002 (TW) .................. 91116930 A

(51) Int. Cl.
*H01L 29/788* (2006.01)

(52) U.S. Cl. .................. 257/316; 257/E27.103; 257/E29.301

(58) Field of Classification Search ........ 257/314–316, 257/E21.422, E27.103, E29.301
See application file for complete search history.

(56) References Cited

U.S. PATENT DOCUMENTS

| | | | | |
|---|---|---|---|---|
| 5,281,548 A * | 1/1994 | Prall | .......................... | 438/259 |
| 5,493,138 A * | 2/1996 | Koh | ........................ | 257/314 |
| 5,796,140 A * | 8/1998 | Tomioka | ..................... | 257/316 |
| 5,858,840 A * | 1/1999 | Hsieh et al. | ................. | 438/266 |
| 5,872,036 A * | 2/1999 | Sheu | ......................... | 438/266 |
| 6,093,945 A * | 7/2000 | Yang | .......................... | 257/317 |
| 6,130,132 A * | 10/2000 | Hsieh et al. | ................. | 438/264 |
| 6,180,980 B1 * | 1/2001 | Wang | ......................... | 257/331 |
| 6,229,176 B1 * | 5/2001 | Hsieh et al. | ................. | 257/316 |
| 6,248,631 B1 * | 6/2001 | Huang et al. | ................ | 438/260 |
| 6,262,452 B1 * | 7/2001 | Ono et al. | .................... | 257/316 |
| 6,300,196 B1 * | 10/2001 | Chang | ........................ | 438/257 |
| 6,323,514 B1 * | 11/2001 | Kao | ............................ | 257/315 |
| 6,333,228 B1 * | 12/2001 | Hsieh et al. | ................. | 438/257 |
| 6,368,976 B1 * | 4/2002 | Yamada | ...................... | 438/713 |
| 6,410,957 B1 * | 6/2002 | Hsieh et al. | ................. | 257/321 |
| 6,413,818 B1 * | 7/2002 | Huang et al. | ................ | 438/257 |
| 6,448,605 B1 * | 9/2002 | Chang | ........................ | 257/314 |
| 6,504,207 B1 * | 1/2003 | Chen et al. | .................. | 257/319 |
| 6,528,844 B1 * | 3/2003 | Hopper et al. | .............. | 257/316 |
| 6,562,673 B2 * | 5/2003 | Lin | ............................ | 438/211 |
| 6,589,842 B2 * | 7/2003 | Huang | ........................ | 438/261 |
| 6,646,301 B2 * | 11/2003 | Yamada | ...................... | 257/320 |
| 6,653,188 B1 * | 11/2003 | Huang et al. | ............... | 438/257 |
| 6,660,588 B1 * | 12/2003 | Yang et al. | .................. | 438/257 |

(Continued)

*Primary Examiner*—Mary Wilczewski
*Assistant Examiner*—Toniae M Thomas
(74) *Attorney, Agent, or Firm*—Ladas & Parry, LLP

(57) ABSTRACT

A floating gate and fabrication method thereof. A semiconductor substrate is provided, on which an oxide layer, a first conducting layer, and a patterned hard mask layer having an opening are sequentially formed. A spacer is formed on the sidewall of the opening. A second conducting layer is formed on the hard mask layer. The second conducting layer is planarized to expose the surface of the patterned hard mask layer. The surface of the second conducting layer is oxidized to form an oxide layer. The patterned hard mask layer and the oxide layer and the first conducting layer underlying the patterned hard mask layer are removed.

5 Claims, 4 Drawing Sheets

U.S. PATENT DOCUMENTS

| | | | |
|---|---|---|---|
| 6,713,834 B2 * | 3/2004 | Mori et al. | 257/510 |
| 6,770,520 B2 * | 8/2004 | Chuang et al. | 438/197 |
| 6,781,186 B1 * | 8/2004 | Wu | 257/315 |
| 6,872,623 B2 * | 3/2005 | Chuang et al. | 438/257 |
| 6,876,032 B2 * | 4/2005 | Hsieh | 257/315 |
| 2002/0017680 A1 * | 2/2002 | Na et al. | 257/315 |
| 2002/0072184 A1 * | 6/2002 | Higuchi | 438/303 |
| 2002/0187608 A1 * | 12/2002 | Tseng | 438/257 |
| 2003/0111685 A1 * | 6/2003 | Kobayashi et al. | 257/315 |
| 2003/0162347 A1 * | 8/2003 | Wang | 438/201 |
| 2003/0219943 A1 * | 11/2003 | Lin et al. | 438/257 |
| 2004/0016954 A1 * | 1/2004 | Chuang et al. | 257/314 |
| 2005/0227437 A1 * | 10/2005 | Dong et al. | 438/265 |
| 2006/0270186 A1 * | 11/2006 | Tsunomura et al. | 438/439 |

* cited by examiner

FLOATING GATE

CROSS-REFERENCE TO RELATED APPLICATIONS

This application is a continuation of U.S. application Ser. No. 10/764,037 filed on Jan. 23, 2004 now U.S. Pat. No. 7,205,603 which is a divisional of U.S. Pat. No. 6,872,623, filed on Mar. 24, 2003, which claims the benefit of priority from Taiwanese Application No. 91116930 filed on Jul. 29, 2002.

BACKGROUND OF THE INVENTION

1. Field of the Invention

The invention is relates to a floating gate, and more particularly to a floating gate with multiple tips and a method for fabricating the same.

2. Description of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is that it is electrically programmed, but for erasing, EPROM requires exposure to ultraviolet (UV) light.

In many circuit designs it is desirable to have a non-volatile memory device that can be erased and reprogrammed in-circuit, without the need to remove the device for erasing and reprogramming.

EEPROM devices have the advantage of electrical programming and erasing, achieved by charging and discharging actions controlled by the control gate. The actions also affect the conductivity of the channel between source and drain.

One of the advantages of flash memory is its capacity for block-by-block memory erasure. Furthermore, memory erasure is fast, normally taking just 1 to 2 seconds for the complete removal of a whole block of memory. Another advantage of flash memory is that the consumed electricity is low. The voltages of a control gate, a source, and a drain are adjusted to program or erase in a split gate flash memory.

FIGS. 1a to 1c are cross-sections of the conventional method for fabricating a floating gate of a split gate flash memory.

In FIG. 1a, a silicon substrate 101 is provided. A gate oxide layer 102, a doped polysilicon layer 103, and a nitride layer 104 having an opening 105 are sequentially formed on the silicon substrate 101.

In FIG. 1b, the doped polysilicon layer 105 exposed by the opening 105 is oxidized to form an oxide layer 106 with a Bird's Beak shape edge.

In FIG. 1c, the nitride layer 104 is removed. The doped polysilicon layer 103 is anisotropically etched to form a floating gate 103a using the oxide layer 106 as an etching mask.

A split gate flash memory is completed after a control gate is formed on the floating gate and the silicon substrate 101 is implanted to form source/drain devices.

In the program step, high voltage is applied between the source and drain. More high voltage is applied to the control gate and goes to the floating gate by the electric capacity coupling, and a high electric field is produced on the film gate oxide layer. The voltage is injected into the floating gate through the film gate oxide layer from the drain.

In the erase step, high voltage is applied between the drain and the control gate. A high electric field is produced on the film gate oxide layer by the electric capacity coupling. The voltage is injected into the drain through the film gate oxide layer from the floating gate. The gate oxide layer is damaged by the high voltage.

When the edge of the floating gate is a tip, the electrical field is easily concentrated in the tip, and the point is easily discharged. If the point discharge is increased, the erasing effect is stronger.

In addition, the die size is larger due to the addition of programming circuitry and there are more processing and testing steps involved in the manufacture of these types of memory devices.

SUMMARY OF THE INVENTION

The present invention is directed to a floating gate with multiple tips and a method for fabricating the same.

Accordingly, the present invention provides a method for fabricating a floating gate. A semiconductor substrate is provided. An oxide layer, a first conducting layer, and a patterned hard mask layer having an opening are sequentially formed on the semiconductor substrate. A spacer is formed on the sidewall of the opening. A second conducting layer is formed on the hard mask layer. The second conducting layer is planarized to expose the surface of the patterned hard mask layer. The surface of the second conducting layer is oxidized to form an oxide layer. The patterned hard mask layer and the oxide layer and the first conducting layer underlying the patterned hard mask layer are removed.

Accordingly, the present invention also provides a method for fabricating a floating gate, in which, first, a semiconductor substrate is provided. A gate oxide layer, a first poly layer, and a patterned hard mask layer having an opening are sequentially formed on the semiconductor substrate. The partial surface of the first poly layer is exposed through the opening. An insulating layer is conformably formed over the patterned hard mask layer and the opening. The insulating layer comprises anisotropically etched to form a spacer on the sidewall of the opening. A second poly layer is conformably formed over the patterned hard mask layer, the opening, and the spacer. The opening is filled with the second poly layer. The surface of the second poly layer is partially oxidized to form an oxide layer. The patterned hard mask layer and the exposing oxide layer are removed using the oxide layer as a mask.

Accordingly, the present invention also provides a floating gate comprising a first conducting layer having a first tip and a second conducting layer having a second tip. The second conducting layer is formed on the first conducting layer. The floating gate with multiple tips is constructed by the first conducting layer and the second conducting layer.

Accordingly, the present invention also provides a floating gate comprising a first conducting layer having a first top portion with a first tip and a first bottom portion, and a second conducting layer having a second top portion with a second tip and a second bottom portion. The second conducting layer is formed on the first conducting layer. The width of the second top portion is equal to the width of the first top portion. The width of the second bottom portion is less than the width of the first top portion. The floating gate with multiple tips is constructed by the first conducting layer and the second conducting layer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2h are cross-sections of the method for fabricating a floating gate of a split gate flash memory of the present invention.

Figure 1A:
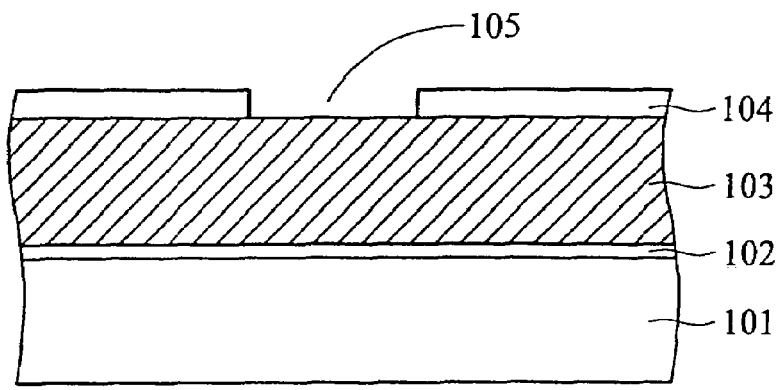
FIGS. 1a to 1c are cross-sections of the conventional method for fabricating a floating gate of a split gate flash memory.
Figure 1B:
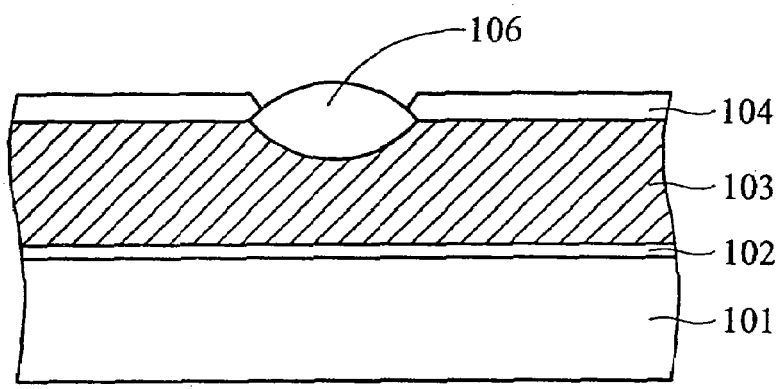
Figure 1C:
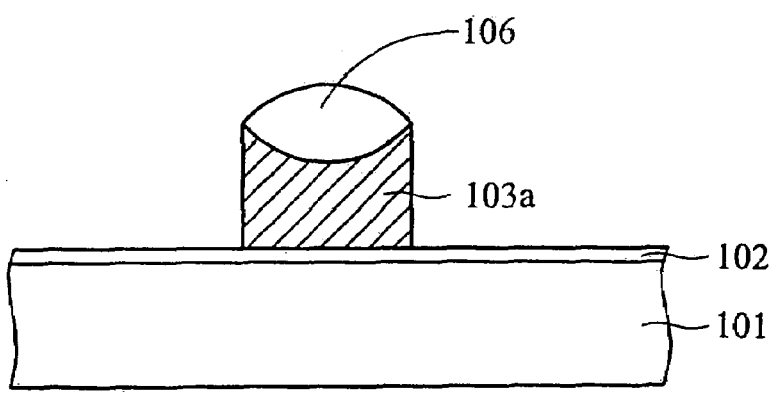
Figure 2A:
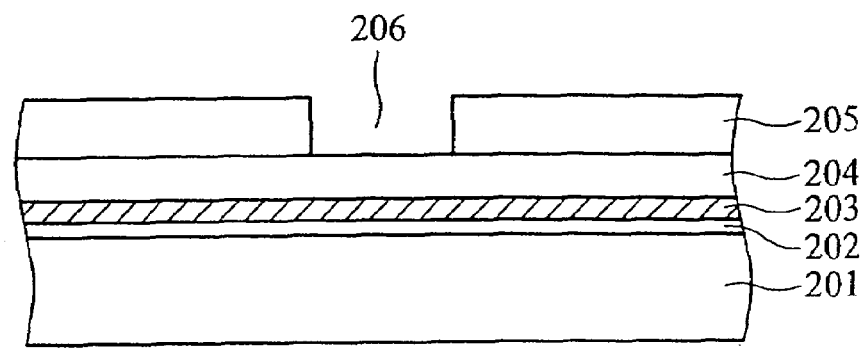
FIGS. 2a to 2h are cross-sections of the method for fabricating a floating gate of a split gate flash memory of the present invention.

In FIG. 2a, a semiconductor substrate 201 is provided. An oxide layer 202, such as gate oxide layer, a first conducting layer 203, such as a poly layer, a hard mask layer 204, such as a nitride layer, and a patterned photoresist layer 205 having an opening 206a are sequentially formed on the semiconductor substrate 201. The opening 206a exposes a partial surface of the hard mask layer 204. The position of the opening 206 is the position of the floating gate.

Figure 2B:
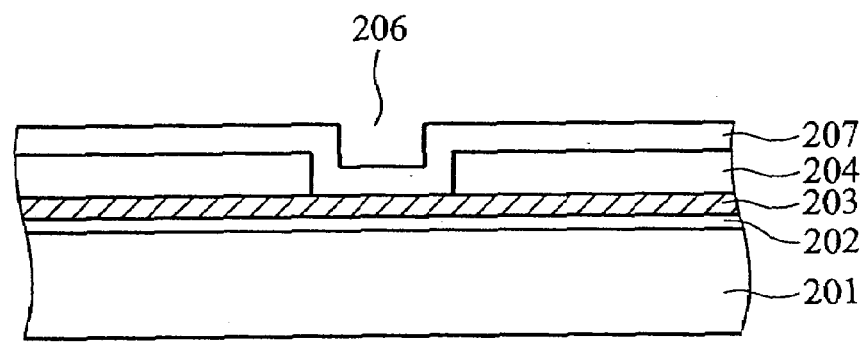

In FIG. 2b, an opening 206 is formed on the hard mask layer 204 using the patterned photoresist layer 205 as a mask, and the opening 206 is identical to the opening 206a. The opening 206 exposes a partial surface of the first conducting layer 203. An insulating layer 207, such as oxide layer, is conformably formed on the surface of the hard mask layer 204 and the opening 206.

Figure 2C:
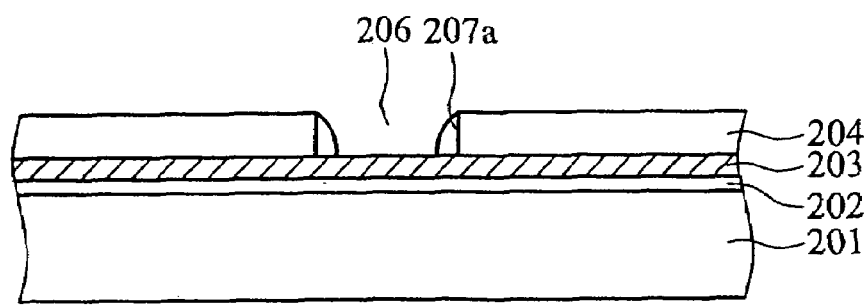

In FIG. 2c, the insulating layer 207 is anisotropically etched to form a spacer 207a on the sidewall of the opening 206. The hard mask layer 204 is not damaged since the material of the hard mask layer is different from the insulating layer 207 in this anisotropic etching process.

Figure 2D:
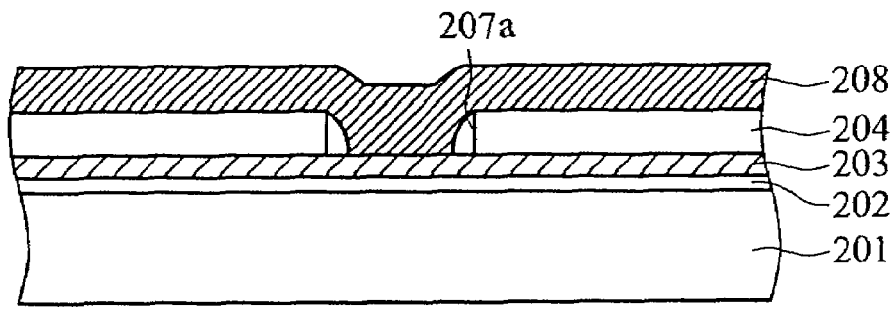

In FIG. 2d, a second conducting layer 208, such as a poly layer, is formed on the hard mask layer 204. The second conducting layer 208 fills the opening 206 and connects to the first conducting layer 203.

Figure 2E:
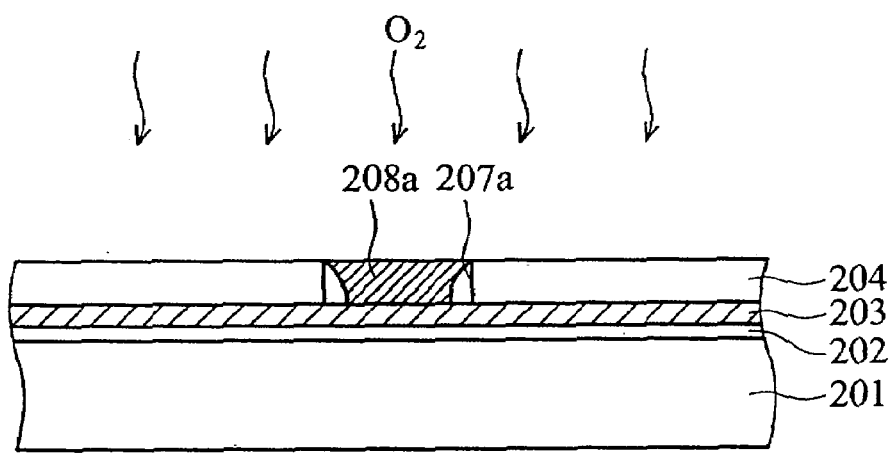

In FIG. 2e, the second conducting layer 208 is planarized to expose the surface of the patterned hard mask layer 204, and the second conducting layer 208 is removed except for the second conducting layer 208a filling in the opening 206. For example, the planarizing step can be chemical mechanical polishing.

Figure 2F:
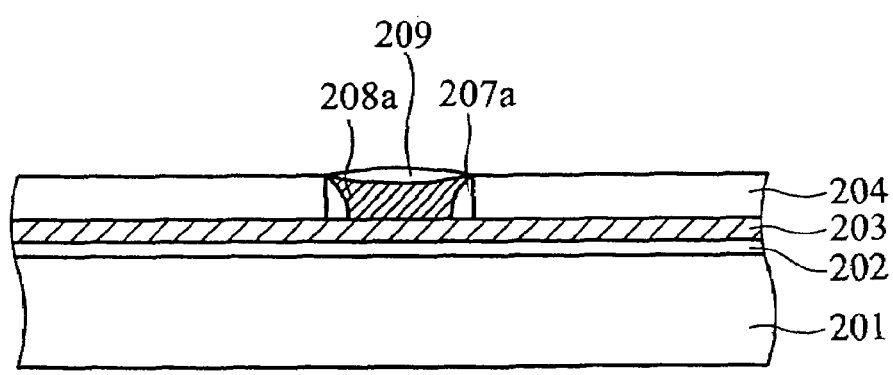

In FIG. 2f, the second conducting layer 208a is oxidized to form an oxide layer 209 with a Bird's Beak edge, such as a Siliziumoxid layer. The oxidizing step uses a thermal oxidation process. The first conducting layer 203 covered by the hard mask layer 204 is not oxidized.

Figure 2G:
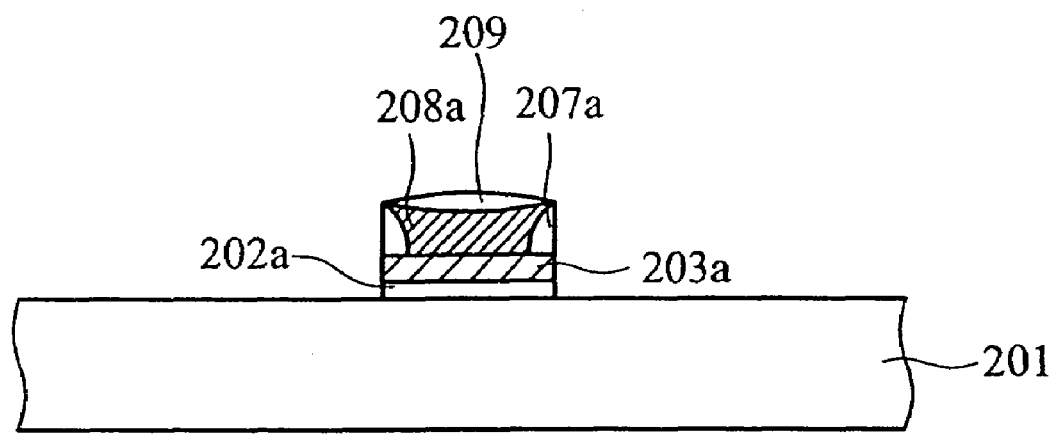

In FIG. 2g, the hard mask layer 204, the first conducting layer 203 and the oxide layer 202 covered by the hard mask layer 204 are sequentially removed using the oxide layer 209 as a mask. The second conducting layer 208a, the first conducting layer 203a, and the oxide layer 202a are not damaged, being covered by the oxide layer 209.

The first conducting layer 203a has a first top portion and a first bottom portion, and the second conducting layer 208a has a second top portion and a second bottom portion. The second bottom is connected to the first top portion, such that the second conducting layer 208a is formed on the first conducting layer 203.

The width of the second top portion is equal to the width of the first top portion, but the width of the second bottom portion is less than the width of the first top portion. The edge of the second top portion is a tip by the Bird's Beak shaped oxide layer 209. Therefore, the floating gate with multiple tips is constructed by the first conducting layer 203a and the second conducting layer 208a.

Figure 2H:
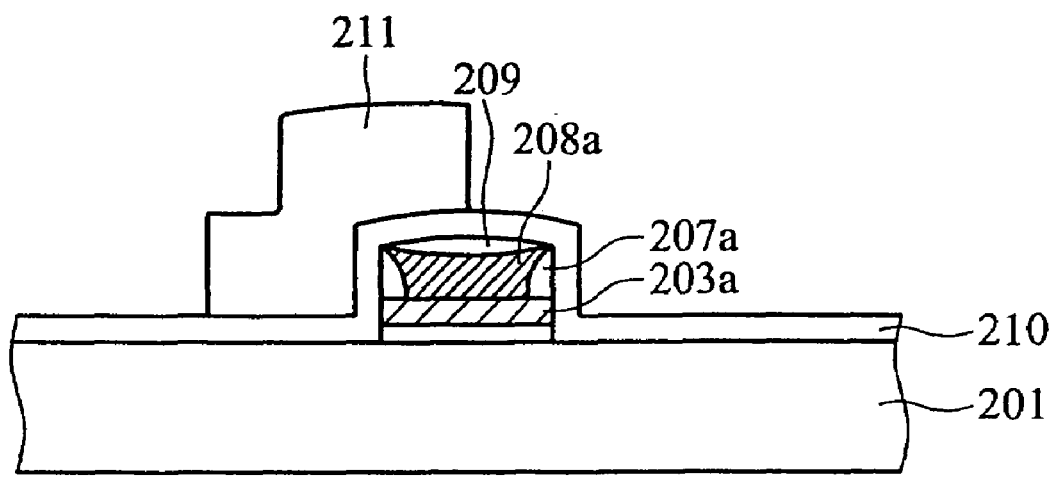

In FIG. 2h, an interpolysilicon dielectric layer 210, such as oxide layer, and a control gate 211 are sequentially formed on the multi-tip floating gate, and semiconductor substrate 201 is implanted to form source/drain devices, and the flash memory is completed.

The floating gate with multiple tips of the present invention includes the tips of the second conducting layer 208a by the oxide layer 209 with the Bird's Beak edge and the tips of the first conducting layer 203a.

The electrical field is easily concentrated in the tip, and the point is easily discharged in the tip. Point discharge is increased by the floating gate's multiple tips in the present invention. Therefore, the data erasing for the flash memory having the floating gate with multiple tips is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A floating gate, comprising:
   a first conducting layer;
   a second conducting layer formed on the first conducting layer with a Bird's Beak edge; and
   an insulating spacer formed on the first conducting layer and sidewalls of the second conducting layer; wherein an outer edge of the insulating spacer is aligned with an outer edge of the first conducting layer.

2. The floating gate as claimed in the claim 1, wherein the first conducting layer comprises a poly layer.

3. The floating gate as claimed in the claim 1, wherein the second conducting layer comprises a poly layer.

4. The floating gate as claimed in the claim 1, wherein a bottom portion of the second conducting layer is narrower than a top portion of the first conducting layer.

5. The floating gate as claimed it the claim 4, wherein a width of a top portion of the second conducting layer is equal to a width of the top portion of the first conducting layer.

* * * * *